United States Patent [19]

MacFall et al.

[11] Patent Number: 4,549,139
[45] Date of Patent: Oct. 22, 1985

[54] METHOD OF ACCURATE AND RAPID NMR IMAGING OF COMPUTED $T_1$ AND SPIN DENSITY

[75] Inventors: James R. MacFall, Hartland; Felix W. Wehrli, Shorewood, both of Wis.

[73] Assignee: General Electric Company, Milwaukee, Wis.

[21] Appl. No.: 500,665

[22] Filed: Jun. 3, 1983

[51] Int. Cl.⁴ .................................... G01R 33/08
[52] U.S. Cl. ............................ 324/309; 324/312
[58] Field of Search ............... 324/300, 307, 309, 312, 324/313, 314

[56] References Cited

U.S. PATENT DOCUMENTS

| | | | |
|---|---|---|---|
| 4,300,096 | 11/1981 | Harrison | 324/309 |
| 4,443,760 | 4/1984 | Edelstein | 324/309 |
| 4,471,306 | 9/1984 | Edelstein | 324/309 |
| 4,475,084 | 10/1984 | Moore | 324/309 |
| 4,484,138 | 11/1984 | Bottomley | 324/309 |
| 4,506,222 | 3/1985 | Edelstein | 324/309 |

*Primary Examiner*—Michael J. Tokar
*Attorney, Agent, or Firm*—Alexander M. Gerasimow; Douglas E. Stoner

[57] ABSTRACT

A method is provided for accurate and rapid NMR imaging of computed $T_1$ and $M_o$ (spin density) NMR images. The imaging data is acquired using a repetition of a sequence made up of RF and magnetic-field-gradient pulses. Each repetition of the sequence includes at least one step of reducing the net longitudinal magnetization in a predetermined region of the sample to zero. The longitudinal magnetization is allowed to at least partially recover prior to exciting nuclear spins in the predetermined region to produce at least one NMR spin-echo signal due primarily to the recovered magnetization. The spin-echo signal is sampled in the presence of a magnetic-field gradient for encoding spatial information.

12 Claims, 6 Drawing Figures

METHOD OF ACCURATE AND RAPID NMR IMAGING OF COMPUTED $T_1$ AND SPIN DENSITY

CROSS REFERENCE TO RELATED APPLICATION

This application is related to commonly assigned patent application Ser. No. (15-NM-2407) entitled "Method Utilizing Combined, Interleaved Pulse Sequences for Reducing Motion Artifacts in Computed $T_1$, $T_2$ and $M_o$ NMR Imaging" filed by J. R. MacFall concurrently with the present application, and which is incorporated herein by reference.

BACKGROUND OF THE INVENTION

This invention relates to nuclear magnetic resonance (NMR) imaging methods. More specifically, the invention relates to improved NMR methods for rapidly and accurately imaging one or more of the computed spin-lattice ($T_1$), and spin-density ($M_o$) parameters.

By way of background, the nuclear magnetic resonance phenomenon occurs in atomic nuclei having an odd number of protons and/or neutrons. Due to the spin of the protons and the neutrons, each such nucleus exhibits a magnetic moment, such that, when a sample composed of such nuclei is placed in a static, homogeneous magnetic field, $B_o$, a greater number of nuclear magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor frequency, is given by the equation $\omega = \gamma B$, in which $\gamma$ is the gyromagnetic ratio which is constant for each NMR isotope and wherein B is the magnetic field acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of a magnetic field oscillating at the Larmor frequency. Typically, such a magnetic field designated $B_1$ is applied in a plane orthogonal to the direction of the static magnetic field by means of a radio frequency (RF) pulse through coils connected to a radio-frequency-transmitting apparatus. The effect of field $B_1$ is to rotate magnetization M about the direction of the $B_1$ field. This may be best visualized if the motion of magnetization M due to the application of RF pulses is considered in a Cartesian coordinate system which rotates at a frequency substantially equal to the resonant frequency $\omega$ about the main magnetic field $B_o$ in the same direction in which the magnetization M precesses (i.e., the rotating frame). In this case, the $B_o$ field is typically chosen to be directed in the positive direction of the Z-axis, which, in the rotating frame, is designated Z' to distinguish it from the fixed-coordinate system. Similarly, the X- and Y-axes are designated X' and Y'. Bearing this in mind, the effect of an RF pulse, then, is to rotate magnetization M, for example, from its direction along the positive Z' axis toward the transverse plane defined by the X' and Y' axes. An RF pulse having either sufficient magnitude or duration to rotate magnetization M into the transverse plane (i.e., 90° from the direction of the $B_o$ field) is conveniently referred to as a 90° RF pulse. Similarly, if either the magnitude or the duration of an RF pulse is selected to be twice that of a 90° pulse, magnetization M will change direction from the positive Z' axis to the negative Z' axis. This kind of an RF pulse is referred to as a 180° RF pulse, or for obvious reasons, as an inverting pulse. It should be noted that a 90° or a 180° RF pulse will rotate magnetization M through the corresponding number of degrees from any initial direction of magnetization M. It should be further noted that an NMR signal will only be observed if magnetization M has a net transverse component (perpendicular to $B_o$) in the transverse plane. Assuming an initial orientation of magnetization M in the direction of the $B_o$ field, a 90° RF pulse produces maximum net transverse magnetization in the transverse plane since all of magnetization M is in that plane, while a 180° RF pulse does not produce any transverse magnetization. 180° RF pulses are frequently utilized to produce NMR spin-echo signals. RF pulses may be selective or nonselective. Selective pulses are typically modulated to have a predetermined frequency content so as to excite nuclear spins situated in preselected regions of the sample having magnetic-field strengths as predicted by the Larmor equation. The selective pulses are applied in the presence of localizing magnetic-field gradients. Nonselective pulses generally affect all of the nuclear spins situated within the field of the RF pulse transmitter coil and are typically applied in the absence of localizing magnetic-field gradients.

There are two exponential time constants associated with longitudinal and transverse magnetizations. The time constants characterize the rate of return to equilibrium of these magnetization components following the application of perturbing RF pulses. The first time constant in referred to as the spin-lattice relaxation time ($T_1$) and is the constant for the longitudinal magnetization to return to its equilibrium value. Spin-spin relaxation time ($T_2$) is the constant for the transverse magnetization to return to its equilibrium value in a perfectly homogeneous field $B_o$. In fields having inhomogeneities, the time constant for transverse magnetization is governed by a constant denoted $T_2^*$, with $T_2^*$ being less than $T_2$.

There remains to be considered the use of magnetic-field gradients to encode spatial information (used to reconstruct images, for example) into NMR signals. Typically, three such gradients are necessary:

$$G_x(t) = \partial B_o / \partial x,$$

$$G_y(t) = \partial B_o / \partial y,$$

and $$G_z(t) = \partial B_o / \partial z.$$

The $G_x$, $G_y$, and $G_z$ gradients are constant throughout the imaging slice, but their magnitudes are typically time dependent. The magnetic fields associated with the gradients are denoted, respectively, $b_x$, $b_y$, and $b_z$, wherein $$b_x = G_x(t)x,$$

$$b_y = G_y(t)y,$$

$$b_z = G_z(t)z,$$

within the volume.

In the application of NMR to medical diagnostic imaging of a live human subject, for example, the intensity of each picture element (pixel) of the image is a complex function of the tissue-related NMR parameters of the NMR pulse sequence utilized to gather the imaging information. The tissue-related NMR parameters are the afore-described $T_1$ and $T_2$ relaxation times, as well as the spin density ($M_o$) of the particular nuclear species ($H^1$, $P^{31}$, $C^{13}$, etc.) imaged. The proton ($H^1$) is a typically selected nuclear species for NMR study, due to its abundance in water associated with tissues. The pulse sequence timing parameters of importance for image tissue contrast and intensity are the sequence-repetition time $T_r$ and the NMR spin-echo delay time $T_e$, both of which will be described hereinafter in greater detail.

It is desirable to produce an image in which the intensity of each pixel depends only on $T_1$ or $T_2$ or $M_o$, since such an image would depend only on tissue-related parameters and magnetic-field strength. Hence, such images should be easier to interpret, medically, since the complicated dependence of pixel intensity on, for example, $T_r$, $T_e$, and combinations of $T_1$, $T_2$, and $M_o$ is reduced to a single, linear dependence. In the past, computed $T_1$ images have been produced utilizing an approximation to calculate the $T_1$ values. Due to the approximate nature of the equation utilized in computing $T_1$, it is necessary to use sequence repetition times $T_r$ which are much greater than spin-echo times $T_e$ to preserve accuracy of the computed values. However, scan times are proportional to $T_r$, so that small values of $T_r$ are desirable to keep data collection time short. Typical times to acquire image data in NMR are on the order of several minutes so that physiological processes, such as breathing, cardiac motion, or peristaltic motion can cause motion of tissues between the separate application of the pulse sequences utilized to gather the data, hence, making the calculation inaccurate and lead to motion artifacts in the reconstructed images. Additionally, the computed pixel intensity values are modulated by noise and systemic errors present in any actual NMR system. The values computed for $T_1$, for example, will be in error by an amount related to such noise. A conventional method to improve accuracy is to increase the number of scans to more than two using different values of $T_r$ for each new scan. However, for the reasons stated, the scan times become unacceptably long. It is, therefore, a principal object of the present invention to provide NMR pulse sequences which enable NMR imaging data to be collected rapidly and for constructing computed images having improved accuracy.

SUMMARY OF THE INVENTION

An inventive NMR method is provided for imaging a predetermined region of a sample positioned in a homogeneous magnetic field so as to produce a net longitudinal magnetization in the region. In the course of a complete scan to obtain imaging data, the predetermined region is subjected to a plurality of repetitions of a sequence composed of rotating magnetic field and magnetic-field-gradient pulses. Each repetition of the sequence includes at least one step of reducing the longitudinal magnetization to zero. The longitudinal magnetization is allowed to recover along the direction of the homogeneous magnetic field for a recovery time $T_d$. The nuclear spins in the predetermined region are then excited so as to produce at least one NMR spin-echo signal due primarily to the recovered longitudinal magnetization. The spin-echo signal is sampled in the presence of at least one magnetic-field gradient for encoding spatial information into the spin-echo signal.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
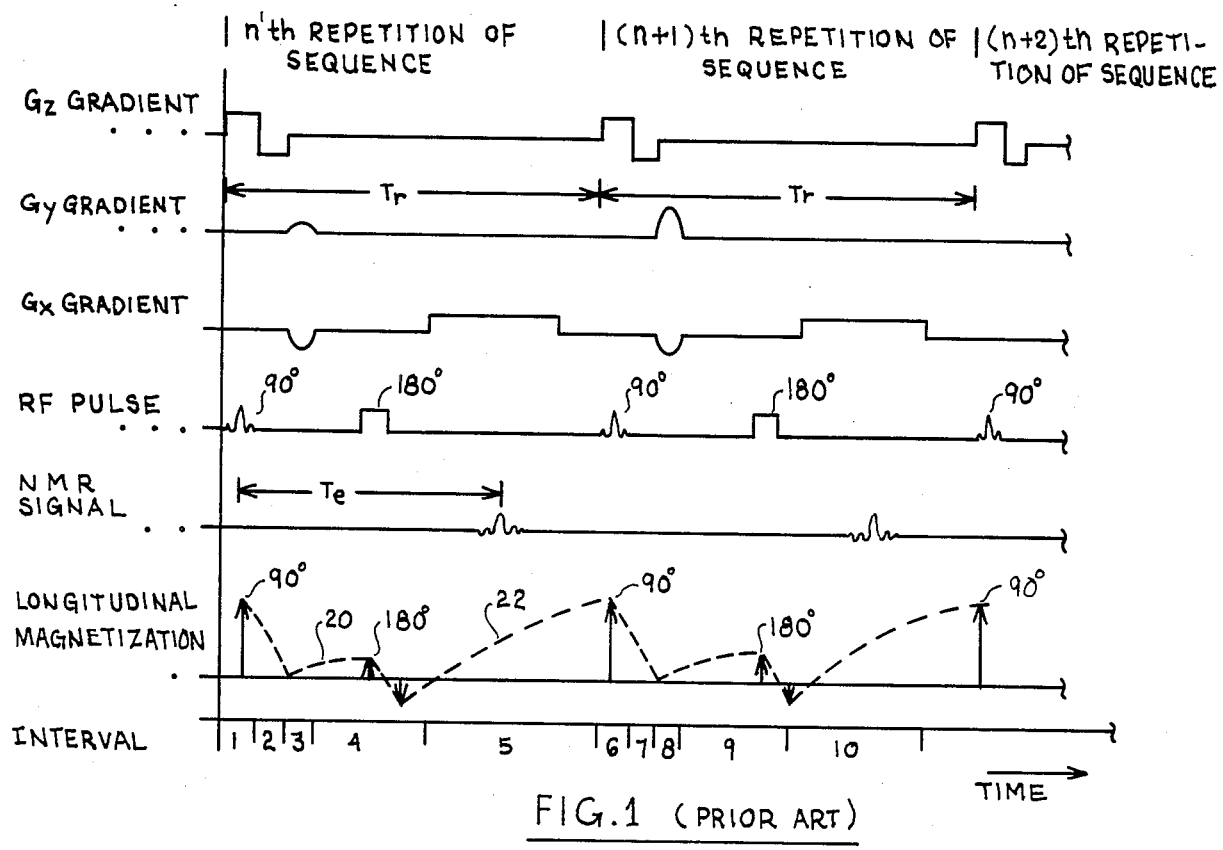
FIG. 1 depicts a conventional NMR pulse sequence utilized in the spin-warp method of imaging, and includes a schematic illustration of the evolution of the longitudinal magnetization.

It will be beneficial to the understanding of the present invention to consider a conventional NMR pulse sequence depicted in FIG. 1. This sequence is the spin-warp version of the two-dimensional Fourier imaging method. The pulse sequence is described, for example, in Kaufman, et al Eds; "Nuclear Magnetic Resonance Imaging in Medicine," Igaku-Shoin Publishers, 1981.

Referring now to FIG. 1, it will be seen that in interval 1, indicated along the horizontal axis, a positive $G_z$ gradient pulse is applied. The direction of the $G_z$ gradient is arbitrarily selected to be in the positive Z-axis direction of the Cartesian coordinate system, parallel with the direction of the $B_o$ magnetic field. The $B_o$ field is not shown in any of the Figures depicting pulse sequences, since it is applied continuously during NMR imaging. Also, in interval 1, a selective 90° RF pulse is applied in the presence of the $G_z$ gradient so as to preferentially excite nuclear spins in a predetermined region of a sample (not shown). Typically, the region is selected to be a narrow slice. In the preferred embodiments, the RF pulse is modulated by a sinc function (sin x/x) so as to preferentially excite nuclear spins in an imaging slice having a substantially rectangular profile. When the $G_z$ gradient is turned off, the excited spins precess at the same frequency but are out of phase with one another due to the dephasing effect of the gradient. The nuclear spins are rephased by the application in interval 2 of a negative $G_z$ gradient pulse. Typically, the time integral of the waveform of the $G_z$ gradient over interval 2 required to rephase the spins is approximately equal to the negative one half of the time integral of the positive $G_z$ gradient waveform in interval 1. During interval 3, a phase-encoding $G_y$ gradient is applied simultaneously with the application of a pulsed $G_x$ gradient. The $G_y$ gradient has a single, peak amplitude in the nth repetition of the sequence comprising intervals 1-5. However, in each successive application, such as the (n+1)th repetition of the sequence (e.g., intervals 6-10, FIG. 1), a different amplitude of the phase-encoding gradient is selected. The $G_y$ gradient encodes spatial information in the Y-axis direction by introducing a twist in the orientation of the transverse magnetization by a multiple of $2\pi$. Following the application of the first phase-encoding gradient, the transverse magnetization is twisted into a one-turn helix. Each different amplitude of the $G_y$ gradient introduces a different degree of twist (phase encoding). The number of $G_y$ gradient amplitudes is chosen to be equal to the number of pixels (typically 128 or 256) the reconstructed image will have in the Y-axis direction.

The effect of the $G_x$ gradient in interval 3 is to dephase the nuclear spin by a predetermined amount such that, when a non-selective 180° RF pulse is applied in interval 4, a spin-echo signal will be produced at a delayed time in interval 5. The time of occurrence of the spin-echo signal is determined by the intensity of the $G_x$ gradient applied in interval 3 and the time the 180° RF pulse is applied. Spatial information is encoded in the X-axis direction by the application of a linear $G_x$ gradient in interval 5 causing the nuclear spins to resonate at frequencies characteristic of their locations with respect to the X-axis. The spin-echo signal is sampled in interval 5 a number of times which is typically equal to the number of pixels (typically 128 or 256) the reconstructed image will have in the X-axis direction. The image pixel values are obtained from the sampled signals using a two-dimensional Fourier transform as disclosed, for example, by Kumar et al in J. Mag. Res., Vol. 18, p. 69 (1975). It will be recognized that the spin-echo signals are utilized in the preferred embodiment; however, free induction decay (FID) signals may also be utilized.

The pulse sequence described with reference to FIG. 1 may be used to construct an image in which the intensity of each pixel is a complicated function of various tissue-related NMR parameters, such as, spin-lattice ($T_1$) and spin-spin ($T_2$) relaxation times, and the spin-density ($M_o$) and pulse sequence timing parameters such as the sequence-repetition time $T_r$ and the spin-echo time $T_e$. As shown in FIG. 1, the sequence-repetition time is measured between the application of the $G_z$ gradients in intervals 1 and 6 of the nth and (n+1)th repetition of the pulse sequence, respectively. The spin-echo time is measured between the mean application of the selective 90° RF pulse in interval 1, and the mean occurrence of the spin-echo in interval 5 during the nth repetition of the pulse sequence, for example. This sequence is typically repeated enough times (n=128 or 256) to acquire all of the data necessary to construct an image. This repeated sequence is referred to hereinafter as a "scan."

Figure 2:
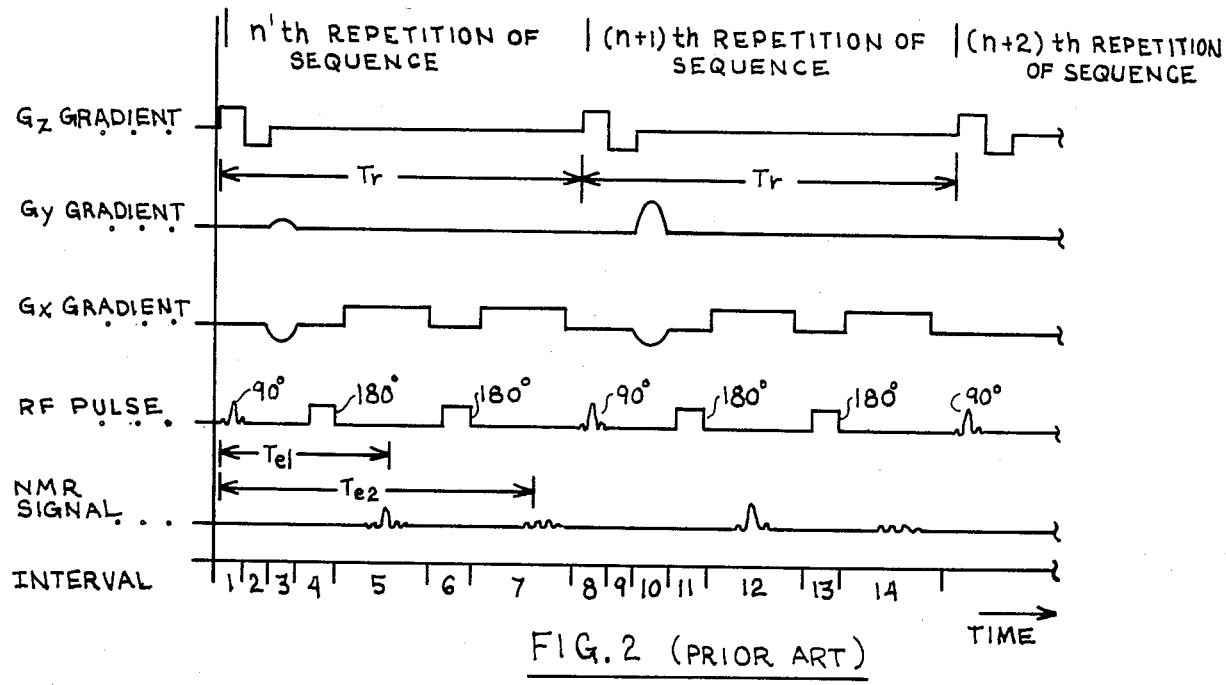
FIG. 2 is a pulse sequence similar to that in FIG. 1. and which is utilized with the methods of the prior art to gather imaging information for constructing computed $T_1$ images.

As described hereinbefore, an image in which the intensity of each pixel depends only on the tissue-related NMR parameters is desirable, since such an image would be easier to interpret. Such images have been produced in the past utilizing, for example, the pulse sequence depicted in FIG. 2 to collect the imaging data. This pulse sequence is substantially identical to that depicted in FIG. 1, but with the exception that additional inverting 180° RF pulses are applied in intervals 6 and 13 of FIG. 2 to produce additional NMR spin-echo signals in intervals 7 and 14, respectively. In accordance with the conventional imaging method, a scan is first performed by selecting the sequence repetition time $T_r$ to be equal to $T_{r1}$. Then, a second scan is performed with $T_r=2T_{r1}$. Each scan produces two images, the first corresponding to the data for a spin-echo signal in interval 5 at $T_e=T_{e1}$, and the second image for the spin-echo signal in interval 7 at $T_e=T_{e2}$. If $I_{11}$ is the intensity of a pixel in the first image from the first scan, and $I_{12}$ is the intensity of the corresponding pixel from the first image of the second scan, then it can be shown that to an approximation:

$$T_1 = -T_{r1}/\ln\left(\frac{I_{22}}{I_{11}} - 1\right), \qquad (1)$$

which is true if $T_r$ is much greater than $T_{e1}$ and $T_{e2}$.

It is apparent that Equation (1) can be used to create a computed $T_1$ image by setting the intensity of the corresponding pixel in the computed $T_1$ image in proportion to the approximate $T_1$ value calculated. In this conventional approach for producing computed $T_1$ images, the two intensities $I_{11}$ and $I_{12}$ are derived from scans separated in time. That is, as described hereinabove, a first scan is performed with a sequence-repetition time $T_{r1}$ and then upon the completion of the first scan, a second scan is performed with a sequence repetition time set to $2T_{r1}$. A drawback associated with this technique is that the approximation of Equation (1) is useful only if the intensities $I_{11}$ and $I_{12}$ represent the same tissue positions. This is a difficult condition to achieve since several minutes are typically required to acquire the NMR image data. During the data-acquisition time, processes, such as cardiac motion, breathing, or peristaltic motion, can cause movement of tissues between the separate scans. It is apparent, therefore, that, since scan times are proportional to the value of $T_{r1}$, small values of $T_{r1}$ are desirable. Additionally, the values $I_{11}$ and $I_{12}$ include noise contributions and systematic errors due to instrumentation. The value computed for $T_1$ will be in error by an amount related to such noise. A method to improve the accuracy of $T_1$ is to increase the number of scans to more than two using different values of $T_r$ for each new scan. However, since Equation (1) is valid only provided that $T_r \gg T_e$ it is mandatory that $T_r$ be kept longer than 500 msec. This means that the scan time will become unacceptably long.

The dimension of the error may be appreciated by considering the exact equations defining $I_{11}$ and $I_{12}$:

$$I_{11} = AM_oe^{-T_e/T_2}(1 - 2e^{-(T_{r1}-T_e/2)/T_1} + e^{-T_{r1}/T_1}) \qquad (2a)$$

and $$I_{12} = AM_oe^{-T_e/T_2}(1 - 2e^{-(T_{r2}-T_e/2)/T_1} + e^{-T_{r2}/T_1}) \qquad (2b)$$

The approximation made in using Equation (1) is to assume $T_e/2 \ll T_{r1}$ and $T_{r2}$. Then Equations (2a) and (2b) simplify to $$I_{11} = AM_oe^{-T_e/T_2}(1 - e^{-T_{r1}/T_1}) \qquad (3a)$$

-continued
$$I_{12} = AM_oe^{-T_e/T_2}(1 - e^{-T_{r2}/T_1}) \tag{3b}$$

From the ratio of Equations (3a) and (3b) and the relation $T_{r2}=2T_{r1}$, Equation (1) follows. Using typical values for $T_e$ and $T_{r1}$ of $T_e=30$ msec., $T_{r1}=500$ msec., it can be shown that values of $T_1$ above 200 msec. computed in this fashion will be in error by more than 10%. The error increases rapidly as the value of $T_{r1}$ is decreased.

The effects of the 90° and 180° RF utilized in the conventional pulse sequence of FIG. 1 on the longitudinal magnetization M may be appreciated by reference to waveform J (FIG. 1). In interval 1, magnetization M is reduced to zero by the application of the 90° RF pulse to create a transverse magnetization. In intervals 2, 3, and 4, prior to the application of the application of the inverting 180° RF pulse, the longitudinal magnetization undergoes a recovery as indicated by dashed line 20 in FIG. 1, and is inverted by the 180° RF pulse. Recovery proceeds along line 22 until the application of a 90° RF pulse in interval 6 when the process is again repeated. $T_1$ information is encoded into the spin-echo signals by performing at least two scans utilizing two different sequence-repetition times ($T_{r1}$ and $T_{r2}$). The variation in the $T_r$ allows magnetization M to recover to different levels along curve 22. Since the magnitude of the NMR signal is directly related to the extent of recovery (i.e., to the magnitude of recovered magnetization M), $T_1$ information is encoded into the signals. The inversion of the magnetization using the 180° RF pulse increases the recovery time. Additionally, pixel intensity is made dependent on two time intervals, $T_e$ and $T_r$, as is apparent from Equations (2a) and (2b).

In accordance with the invention, a pulse sequence is provided in which the dependence on $T_1$ is accurately represented by a simple equation of the form of Equations (3a) or (3b) thereby simplifying computations for image reconstruction. One embodiment of the inventive pulse sequence is depicted in FIG. 3.

Figure 3:
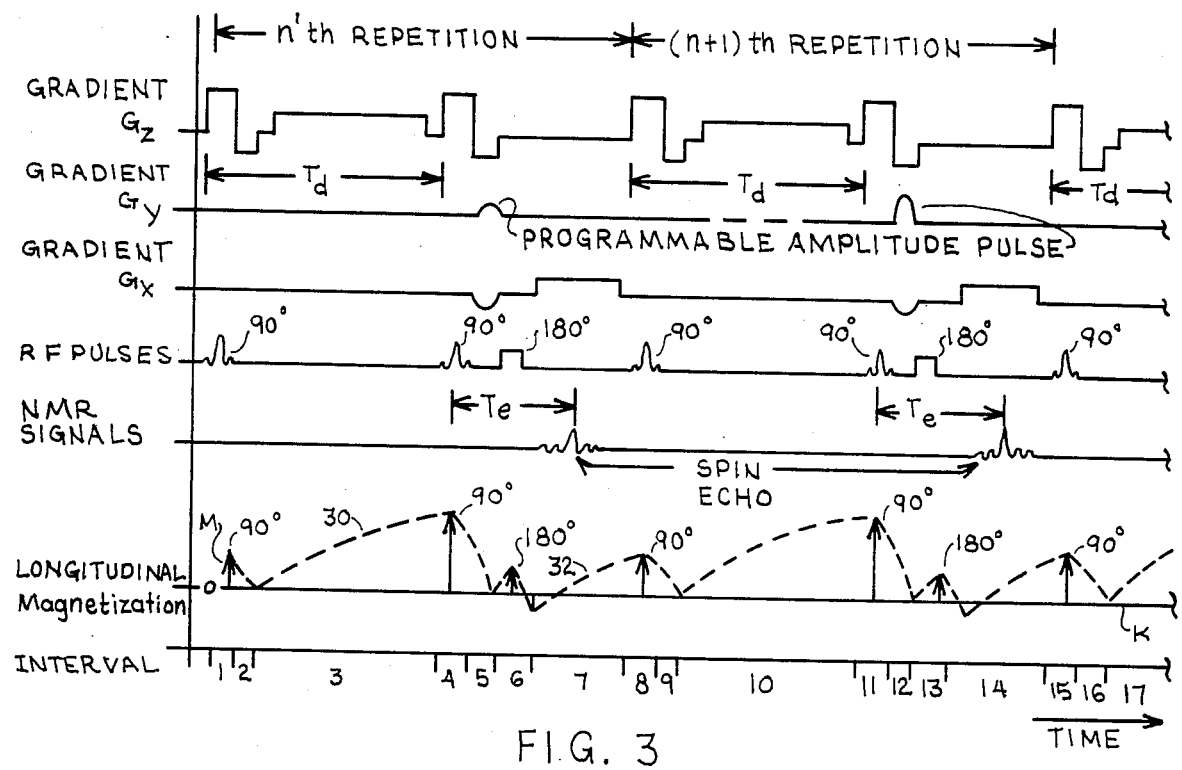
FIG. 3 depicts one exemplary embodiment of a pulse sequence in accordance with the invention for $T_1$ determinations, and includes a schematic illustration of the evolution of the longitudinal magnetization.

Referring now to FIG. 3, taken individually, portions of the pulse sequence depicted therein (e.g., intervals 4-7, 11-14, etc.) are similar to those of the conventional spin-warp sequence described hereinbefore with reference to FIG. 1. The manner in which the inventive pulse sequence is implemented to collect NMR imaging data is, however, substantially different. In accordance with the inventive pulse sequence, during the n'th repetition of the pulse sequence, a 90° RF pulse is applied in interval 1 in the presence of a $G_z$ gradient pulse to reduce longitudinal magnetization M to zero in an imaging slice, as seen in curve K. A $G_z$ gradient is applied in interval 3 following the application of the 90° RF pulse. The effect of the gradient is to rapidly disperse the phase coherence of the transverse magnetization in the imaging slice. Without the gradient, a free induction signal (FID) would occur and would persist into intervals 4-7, for example, of the pulse sequence, causing erroneous results. The gradient is shown for the Z-gradient direction but could be applied in the X- or Y-gradient direction. The strength is adjusted until effects of the FID are sufficiently attenuated. Typically, other gradient pulses will have to be adjusted slightly to compensate for this gradient's effects. Saturation of the nuclear spins in the imaging slice may also be accomplished by the application of a train (5-10) of randomly spaced selective 90° RF pulses, as described by Markley et al in J. of Chem. Phys., Vol. 55, p. 3604 (1971).

The zeroed longitudinal magnetization is allowed to evolve along line 30 of curve K without inversion in a time interval $T_d$ which is measured between the respective applications of the $G_z$ gradients in intervals 1 and 4, for instance. A detection 90° RF pulse is applied in interval 4, and a spin-echo signal is observed in interval 7 (at a time $T_e$ following the mean application of the 90° RF pulse in interval 8 and the mean occurrence of the signal), due to the application of an inverting 180° RF pulse in interval 6. The recovery of magnetization M along line 32 (intervals 6 and 7) is not significant to encoding $T_1$ information, since magnetization M is again reduced to zero by the application of a 90° RF pulse and $G_z$ phase-dispersing gradient in intervals 8 and 10 during the (n+1)th repetition of the sequence. It should be noted that a different amplitude of the phase-encoding $G_y$ gradient is applied in interval 12. The repetition of the sequence is continued with a different $G_y$ gradient amplitude in each repetition until the scan is completed.

As a result of the implementation of the pulse sequence in accordance with the invention, the image pixel intensity, I, may now be exactly expressed as:

$$I = AM_oe^{-T_e/T_2}(1 - e^{-T_d/T_1}), \tag{4}$$

Hence, an equation similar to Equation (1) can be used to compute $T_1$ for each pixel from $I_1$, $I_2$ derived from two separate scans (or from a single scan as will be described hereinafter with reference to FIG. 4) with $T_{d2}=2T_{d1}$ from the equation:

$$T_1 = -T_{d1}/\ln\left(\frac{I_2}{I_1} - 1\right) \tag{5}$$

A further advantage is that values of $T_d$ can be made very small (e.g. 50 msec.) without affecting the accuracy of the equation. Hence, several scans of varying $T_d$ can be performed in the time that the conventional technique required for a single scan, of course, at the expense of some signal-to-noise (S/N). For instance, with $T_e=30$ msec., $T_d=100$ msec., $T_r$ would be about 200 msec. in the new technique. Also, for $T_d=200$ msec., $T_e=30$ msec., $T_r$ would be about 300 msec. in the new technique. Hence, these two scans would take no more time than the conventional technique described with reference to FIG. 2 with $T_r=500$ msec. The new scans would be more accurate when using Equation (1).

The conventional technique can use more complex mathematical techniques to compute $T_1$, from e.g., Equations (2a) and (2b), to an equal accuracy, but this will in general require more time or more expensive computational equipment. However, the inventive pulse sequence permits the value to be computed using a simpler equation, such as Equations (3a) and (3b), with comparable accuracy. Such a sequence may be similar to that depicted in FIG. 5, but with a single spin echo after each recovery time $T_d$ (i.e., with only the spin-echo signal of interval 7).

Figure 4:
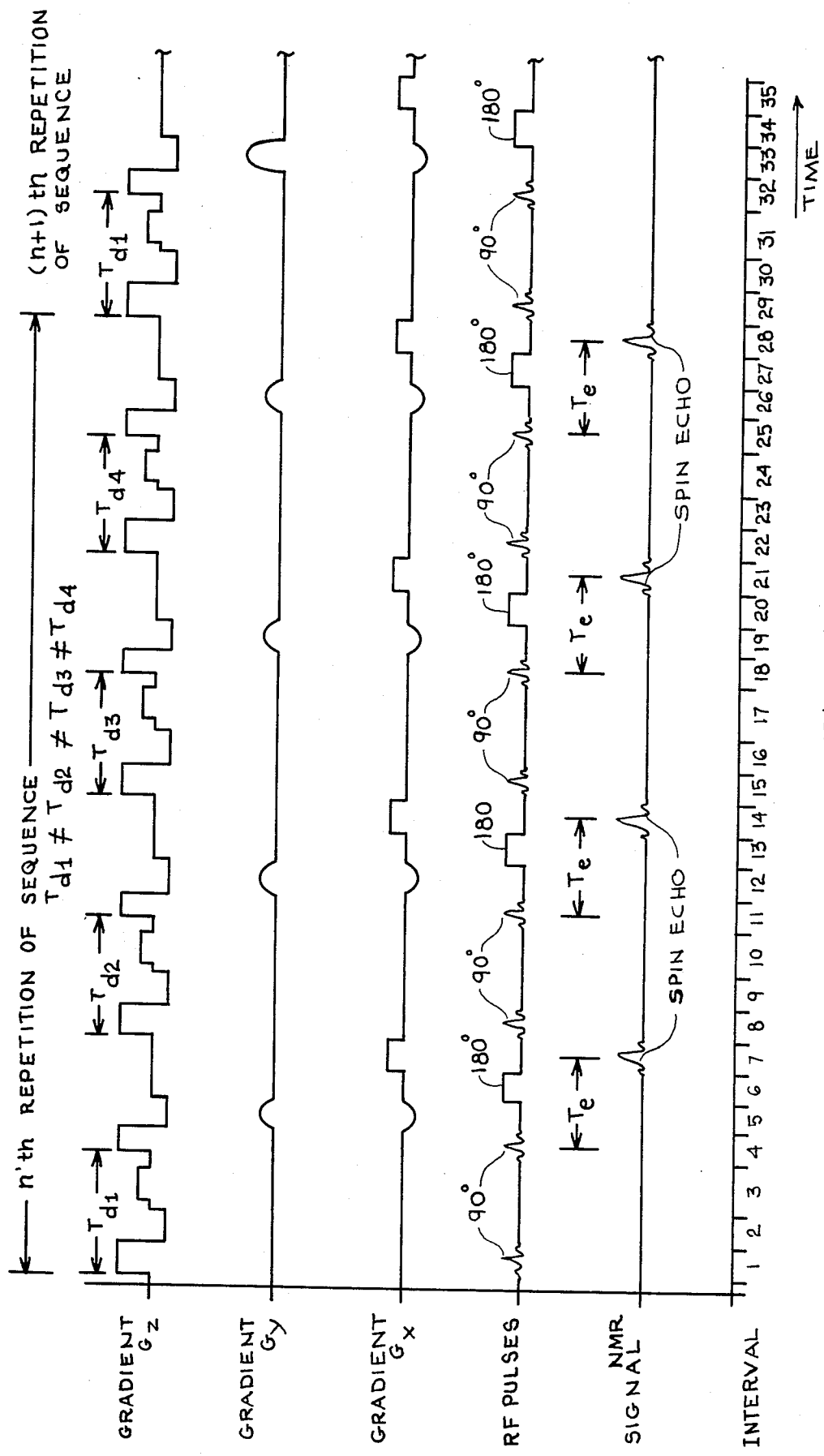
FIG. 4 illustrates another exemplary embodiment of the inventive NMR pulse sequence implemented with four different recovery times in a single scan for determining $T_1$.

The pulse sequence of FIG. 3 may be extended within the scope of the invention to an interleaved sequence such as that depicted in FIG. 4. In this case, as part of a single repetition (n'th, for instance) of the pulse sequence, data is acquired for multiple delays $T_d$. In FIG.

4, four different recovery times $T_{d1}-T_{d4}$ are implemented in intervals 3, 10, 11, and 31, respectively. The corresponding spin-echo signals observed in intervals 7, 11, 21, and 28 then convey different $T_1$ information. An advantage associated with the use of an interleaved pulse sequence is that data is collected close in time within, for instance, the n'th repetition of the sequence so that tissue motion is negligibly small or non-existent.

The sequence is repeated during the (n+1)th implementation with the same recovery times $T_{d1}-T_{d4}$, but with a different amplitude of the phase-encoding $G_y$ gradient in interval 33. The number of recovery times has been selected to equal four for illustration only. The number may be larger or smaller.

Figure 5:
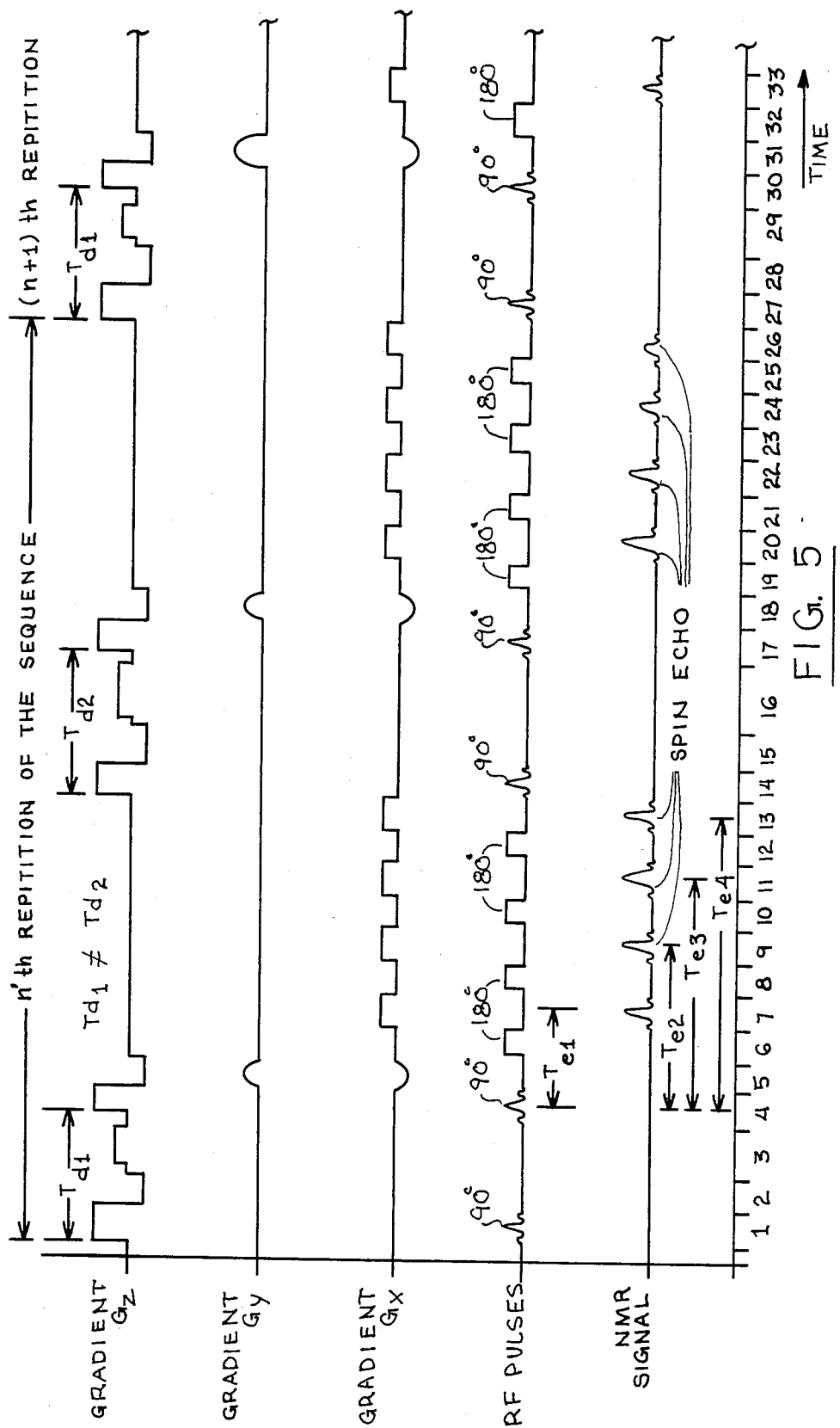
FIG. 5 is as yet another exemplary embodiment of the inventive NMR pulse sequence implemented in combination with two different recovery times and four different spin-echo-delay times for simultaneous $T_1$, $T_2$, and $M_o$ determination.

The interleaved pulse sequence of FIG. 4 may be modified in the manner depicted in FIG. 5 to allow enough image data to be collected to construct computed $T_1$, $T_2$ and spin-density ($M_o$) images to be constructed from a single scan. As in FIG. 4, this sequence utilizes two different recovery times $T_{d1}$ and $T_{d2}$ interleaved within each repetition of the pulse sequence. Additionally, multiple spin echoes are produced for each of the recovery times. Spin-echo signals in intervals 7, 9, 11, 13 are produced by the application of 180° RF pulses in intervals 6, 8, 10, and 12, respectively, for recovery delay $T_{d1}$. Similarly, spin-echo signals are created in intervals 20, 22, 24, and 26 from the application of 180° RF pulses in intervals 19, 21, 23, and 25, respectively, for recovery delay $T_{d2}$. The sequence is repeated for a different amplitude of the $G_y$ phase-encoding gradient in the (n+1)th and subsequent repetitions. The spin-echo signals are observed at different spin-echo delay times $T_{e1}$, $T_{e2}$, $T_{e3}$, and $T_{e4}$.

The values for $T_1$, $T_2$, and $M_o$ are computed using data collected with the pulse sequences of either FIG. 4 or FIG. 5 from the following equation of the general form:

$$I_{ij} = AM_o e^{-T_{ej}/T_2}(1 - e^{-T_{di}/T_2}),$$

in which i indexes the recovery delay ($T_{d1}$, $T_{d2}$, ... $T_{di}$, etc.) and j indexes the spin-echo delay ($T_{e1}$, $T_{e2}$, ... $T_{eg}$, etc.) The equation may be solved using conventional methods such as iterative chi-square minimization techniques.

The preferred embodiments of the invention have been described hereinabove with reference to the spin-warp-imaging technique. It will be recognized, however, that the invention may be advantageously practiced with other pulse sequences. One example of such a pulse sequence is the multiple-angle-projection-reconstruction pulse sequence depicted in FIG. 6 which is similar in many respects to that of FIG. 3. As in FIG. 3, a single scan is performed with the sequence of FIG. 6 to acquire data using a 90° RF pulse and a phase-dispersing gradient during each repetition of the pulse sequence. The spin-echo signals are observed in intervals 7 and 14 during the n'th repetition of the sequence, for example, at echo-delay times $T_e$ following the application of the 90° RF pulses in intervals 4 and 11, respectively.

Figure 6:
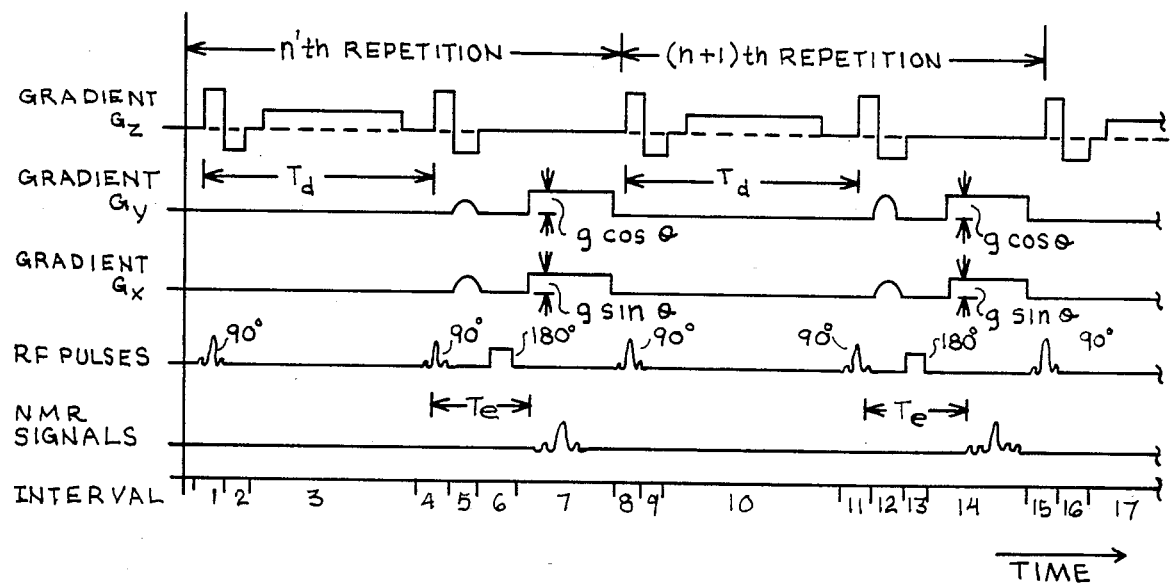
FIG. 6 depicts still another exemplary embodiment of the invention similar to that in FIG. 3 but using the technique of multiple-angle-projection reconstruction to encode spatial information into the NMR signals.

The primary difference between the pulse sequence of FIG. 6 and that of FIG. 3 is in the manner in which spatial information is encoded into the spin-echo signals. This difference will be described in an exemplary manner with reference to the spin-echo signal observed in interval 7 of FIG. 6. The description is, however, equally applicable to the spin-echo signal observed in interval 14, as well as in subsequent repetitions of the sequence. It should be initially noted that the $G_y$ gradient applied in interval 5 is not a phase-encoding gradient but is, rather, a gradient pulse used in combination with the positive $G_x$ gradient pulse, also in interval 2, to time the occurrence of the spin-echo signal in interval 7. To encode spatial information into the spin-echo signal, linear $G_y$ and $G_x$ gradients are applied during interval 7. The $G_x$ and $G_y$ gradients are directed, respectively, in the X- and Y-axis directions within the imaging slice. The magnitudes of the $G_x$ and $G_y$ gradients in interval 7 determine the projection angle $\theta$. The magnitude of the $G_x$ gradient is made proportional to the sine of the projection angle, while the magnitude of the $G_y$ gradient is made proportional to the cosine of the projection angle. The $G_x$ and $G_y$ gradients add vectorially to produce a resultant gradient in the imaging plane at a direction $\theta$. Nuclear spins situated along the direction of the resultant gradient experience different magnetic fields and, therefore, resonate at different frequencies which may be ascertained in a well-known manner by Fourier transformation of the spin-echo signal. Fourier transformation of the signal yields the magnitude of the signal at each frequency and, therefore, at each location with respect to the direction of the gradient. The nuclei situated along each line perpendicular to the direction of the gradient have the same resonant frequency. In successive applications (such as the [n+1]th repetition of the sequence), as is necessary in order to obtain sufficient information to image an entire slice, multiple projections are obtained by changing projection angle $\theta$ by an amount $\Delta\theta$, typically of the order of 1°, to collect spatial information from 180 projections in at least a 180° arc.

It will be recognized that the pulse sequence depicted in FIG. 6 is the simplest embodiment of the invention utilizing the multiple-angle-projection-reconstruction technique. This pulse sequence can be modified in the manner previously described with reference to FIG. 4 to collect data for more than two interleaved recovery delay times during each repetition of the sequence. Without limiting the number or types of modifications which may be made, the pulse sequence of FIG. 6 may additionally be modified in the manner previously described with reference to FIG. 5 which utilizes two different recovery times and four spin-echo signals within each recovery interval to create a combined sequence that produces sufficient data for computed $T_1$, computed $T_2$, and computed $M_o$ images from a single scan.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. An NMR method of imaging a predetermined region of a sample positioned in a homogeneous magnetic field so as to produce a net longitudinal magnetization in said region, which method comprises:
  subjecting said predetermined region, in the course of a complete scan to obtain data to image said region, to a plurality of repetitions of a sequence composed of rotating magnetic field and magnetic-field-gradient pulses, each repetition of said sequence including at least one step of reducing said longitudinal magnetization to substantially zero;

allowing said longitudinal magnetization to recover along the direction of said homogeneous magnetic field for a recovery time $T_d$;

exciting nuclear spins in said predetermined region so as to produce at least one NMR spin-echo signal due primarily to said recovered longitudinal magnetization; and sampling said spin-echo signal in the presence of at least one magnetic-field gradient for encoding spatial information into said spin-echo signals.

2. The method of claim 1 wherein said step of reducing said longitudinal magnetization to zero comprises:
 (a) irradiating said predetermined region with a 90° RF pulse in the presence of a magnetic-field gradient to rotate said longitudinal magnetization so as to create in said predetermined region a transverse magnetization component; and
 (b) applying a phase-dispersing magnetic-field gradient to destroy said transverse magnetization, said time $T_d$ being measured between the application of said magnetic-field gradient in said step (a) and said step of exciting.

3. The method of claim 1 wherein said step of reducing said longitudinal magnetization to zero comprises sequentially applying a plurality of selective 90° RF pulses to saturate nuclear spins in said predetermined region, said time $T_d$ being measured between the application of the last one of said plurality of 90° RF pulses and said step of exciting.

4. The method of claim 1 wherein each of said repetitions comprises more than one step of reducing said longitudinal magnetization to zero, each followed by a different recovery time $T_d$.

5. The method of claim 4 wherein said step of exciting comprises subjecting said predetermined region in the presence of a magnetic-field gradient to a magnetic field rotating at substantially the Larmor frequency so as to preferentially excite nuclear spins in said region, said NMR spin-echo signal occurring at a time $T_e$ measured between the mean application of said rotating magnetic field and the mean occurrence of said spin-echo signal.

6. The method of claim 5 wherein said rotating magnetic field comprises a selective 90° RF pulse.

7. The method of claim 6 wheren said step of exciting includes the step of irradiating said predetermined region with at least one 180° RF pulse to produce a spin-echo signal.

8. The method of claim 5 wherein said step of exciting comprises producing a plurality of spin-echo signals each occurring at a different time $T_e$.

9. The method of one of claims 1, 4, or 8 wherein said magnetic-field gradient for encoding spatial information is selected to have one of a plurality of directions within said predetermined region for each repetition of said sequence.

10. The method of claim 9 wherein said gradient for encoding spatial information comprises a resultant magnetic-field gradient of the vectorial addition of at least two magnetic-field gradients, which gradients are perpendicular to one another within said predetermined region.

11. The method of one of claims 1, 4, or 8 further comprising the step of applying a variable amplitude magnetic-field gradient having one of a plurality of programmable amplitudes for each repetition of said sequence to encode spatial information into said NMR signals.

12. The method of claim 11 wherein said NMR signals are sampled in the presence of a substantially linear magnetic-field gradient, which gradient is perpendicular to the direction of said variable amplitude gradient within said predetermined region.

* * * * *